(12) United States Patent
Yang et al.

(10) Patent No.: US 11,586,884 B2
(45) Date of Patent: Feb. 21, 2023

(54) ARTIFICIAL NEURONS USING DIFFUSIVE MEMRISTOR

(71) Applicant: University of Massachusetts, Amherst, MA (US)

(72) Inventors: Jianhua Yang, Hadley, MA (US); Qiangfei Xia, Amherst, MA (US); Mark McLean, Severna Park, MD (US); Qing Wu, Manilus, NY (US)

(73) Assignee: University of Massachusetts, Boston, MA (US)

( * ) Notice: Subject to any disclaimer, the term of this patent is extended or adjusted under 35 U.S.C. 154(b) by 945 days.

(21) Appl. No.: 16/270,848

(22) Filed: Feb. 8, 2019

(65) Prior Publication Data

US 2019/0244088 A1    Aug. 8, 2019

Related U.S. Application Data

(60) Provisional application No. 62/628,144, filed on Feb. 8, 2018.

(51) Int. Cl.
  *G06N 3/063*    (2006.01)
  *G06N 3/08*     (2006.01)
  *G06N 3/06*     (2006.01)
  *G06N 3/04*     (2006.01)

(52) U.S. Cl.
  CPC ......... *G06N 3/063* (2013.01); *G06N 3/0454* (2013.01); *G06N 3/061* (2013.01); *G06N 3/08* (2013.01)

(58) Field of Classification Search
  CPC ...... G06N 3/0454; G06N 3/049; G06N 3/061; G06N 3/063; G06N 3/08
  See application file for complete search history.

(56) References Cited

U.S. PATENT DOCUMENTS

2014/0332747 A1* 11/2014 Alekhin ............... H01L 45/08
                                                     257/2

OTHER PUBLICATIONS

Zhang, Xumeng, et al. "An artificial neuron based on a threshold switching memristor." IEEE Electron Device Letters 39.2 (2017):308-311. (Year: 2017).*
Ambrogio, S. et al. *Unsupervised Learning by Spike Timing Dependent Plasticity in Phase Change Memory (PCM) Synapses.* Front. Neurosci. vol. 10 Article 56 (12 pages) (2016).
Burr, G. W. et al. *Experimental Demonstration and Tolerancing of a Large-Scale Neural Network (165 000 Synapses) Using Phase-Change Memory as the Synaptic Weight Element.* IEEE Trans. Electron Devices 62, (2015) (6 pages).
Chouard, T. *The Go Files: AI computer clinches victory against Go champion.* Nat. News doi:10.1038/nature.2016.19553 (3 pages), Mar. 2016.
Chua, L., et al., *Hodgkin-huxley axon is made of memristors.* Int. J. Bifurc. Chaos 22(3) (2012).

(Continued)

*Primary Examiner* — Benjamin P Geib
(74) *Attorney, Agent, or Firm* — Fish & Richardson P.C.

(57) ABSTRACT

A diffusive memristor device and an electronic device for emulating a biological neuron is disclosed. The diffusive memristor device includes a bottom electrode, a top electrode formed opposite the bottom electrode, and a dielectric layer disposed between the top electrode and the bottom electrode. The dielectric layer comprises an oxide doped with a metal.

18 Claims, 6 Drawing Sheets

(56) References Cited

OTHER PUBLICATIONS

Eryilmaz, S. B. et al. *Brain-like associative learning using a nano scale non-volatile phase change synaptic device array* Front. Neurosci. 8, (2014) (11 pages).
Gers, F. A., et al., *Learning to forget: continual prediction with LSTM*. Proc. ICANN'99 Int. Conf. on Artificial Neural Networks (Edinburgh, Scotland) vol. 2, pp. 850-855 (1999).
Gupta, I. et al. *Real-time encoding and compression of neuronal spikes by metal-oxide memristors*. Nat. Commun, 7, 12805 (2016) (9 pages).
Han, J.-H et al. *Neuronal Competition and Selection During Memory Formation*. Science 316, 457-460 (2007).
Hinton and Salakhutdinov, *Reducing the Dimensionality of Data with Neural Networks*. Science 313, 504 507 (2006).
Hochreiter and Schmidhuber, *Long Short-Term Memory*. Neural Comput. 9, 1735-1780 (1997).
Hopfield and Tank, *Computing with neural circuits: a model*. Science 233(4764):625-633 (1986).
Hu, S. G. et al. *Associative memory realized by a reconfigurable memristive Hopfield neural network*. Nat. Commun, 6, 7522 (2015) (8 pages).
Indiveri, G. et al. *Neuromorphic Silicon Neuron Circuits*. Front. Neurosci. 5(73) (2011) (23 pages).
Jeyasingh, et al., *Phase Change Memory: Scaling and applications*, in 2012 IEEE Custom Integrated Circuits Conference (CICC) 1-7 (2012).
Jo, S. H. et al. *Nanoscale Memristor Device as Synapse in Neuromorphic Systems*. Nano Lett. 10, 1297-1301 (2010).
Jo, S. H. et al., *High-Density Crossbar Arrays Based on a Si Memristive System*. Nano Lett. 9, 870-874 (2009).
Johnson and Hogg, *Learning the distribution of object trajectories for event recognition*. Image Vis. Comput. 14, 609-615 (1996).
Kasthuri and Lichtman, *The role of neuronal identity in synaptic competition*. Nature 424, 426-430 (2003).
Kohonen, T. *Essentials of the self-organizing map*. Neural Netw. 37, 52-65 (2013).
La Barbera, et al., *Filamentary Switching: Synaptic Plasticity through Device Volatility*. ACS Nano 9, 941-949 (2015).
Lim, H. et al. *Relaxation oscillator-realized artificial electronic neurons, their responses, and noise*. Nanoscale 8, 9629-9640 (2016).
Lim, H. et al. *Reliability of neuronal information conveyed by unreliable neuristor-based leaky integrate-and-fire neurons: a model study*. Sci. Rep. 5, 9776 (2015) (15 pages).
Lim, H., et al., *Short-term memory of TiO2-based electrochemical capacitors: empirical analysis with adoption of a sliding threshold*. Nanotechnology 24, 384005 (2013).
Liu, Q. et al. *Real-time observation on dynamic growth/dissolution of conductive filaments in oxide-electrolyte-based ReRAM*. Adv. Mater, Deerfield Beach Fla 24, 1844-1849 (2012).
Magee, J. C. *Dendritic integration of excitatory synaptic input*. Nat. Rev. Neurosci. 1, 181-190 (2000).
Mainen and Sejnowski, *Influence of dendritic structure on firing pattern in model neocortical neurons*. Nature 382, 363-366 (1996).
McCulloch and Pitts, *A logical calculus of the ideas immanent in nervous activity*. Bull. Math. Biophys. 5, 115-133 (1943).
Mehonic and Kenyon, *Emulating the Electrical Activity of the Neuron Using a Silicon Oxide RRAM Cell*. Front. Neurosci. vol. 10, Article 57, (2016) (10 pages).
Merolla, P. A. et al. *A million spiking-neuron integrated circuit with a scalable communication network and interface*. Science 345, 668-673 (2014).
Messerschmitt et al., *How Does Moisture Affect the Physical Property of Memristance for Anionic-Electronic Resistive Switching Memories?* Adv. Funct. Mater, 25, 5117-5125 (2015).
Ohno, T. et al. *Short-term plasticity and long-term potentiation mimicked in single inorganic synapses*. Nat. Mater, 10, 591-595 (2011).
Park, J. et al. *TiOx-Based RRAM Synapse With 64-Levels of Conductance and Symmetric Conductance Change by Adopting a Hybrid Pulse Scheme for Neuromorphic Computing*. IEEE Electron Device Lett. 37, 1559-1562 (2016).
Pershin and Ventra, *Neuromorphic, Digital, and Quantum Computation With Memory Circuit Elements*. Proc. IEEE 100, 2071-2080 (2012).
Pickett, M. D., et al., *A scalable neuristor built with Mott memristors*. Nat. Mater. 12, 114-117 (2013).
Prezioso, M. et al. *Training and operation of an integrated neuromorphic network based on metal-oxide memristors*. Nature 521, 61-64 (2015).
Roweis and Saul, *Nonlinear Dimensionality Reduction by Locally Linear Embedding*. Science 290, 2323-2326 (2000).
Serb, A. et al. *Unsupervised learning in probabilistic neural networks with multi-state metal-oxide memristive synapses*. Nat. Commun, 7, 12611 (2016) (9 pages).
Sheridan et al., *Pattern recognition with memristor networks*. in 2014 IEEE International Symposium on Circuits and Systems (ISCAS) 1078-1081 (2014) doi:10.1109/ISCAS.2014.6865326.
Shulaker, M. M. et al. *Three-dimensional integration of nanotechnologies for computing and data storage on a single chip*. Nature 547, 74-78 (2017).
Silver, D. et al. *Mastering the game of Go with deep neural networks and tree search*. Nature 529, 484-489 (2016).
Sourikopoulos, et al. *A 4-fJ/Spike Artificial Neuron in 65 nm CMOS Technology*. Front. Neurosci. vol. 11, Article 123 (2017) (14 pages).
Stoliar, P. et al. *A Leaky-Integrate-and-Fire Neuron Analog Realized with a Mott Insulator*. Adv. Funct. Mater, 27, (2017), doi:10.1002/adfm.201604740, (7 pages).
Strukov, D. B., et al., *The missing memristor found*. Nature 453, 80-83 (2008).
Suri, M. et al. *Phase change memory as synapse for ultra-dense neuromorphic systems: Application to complex visual pattern extraction*. in 2011 International Electron Devices Meeting 4.4.1-4.4.4 (2011) (4 pages).
Tsien, J. Z. *The Memory Code*. Sci. Am. 297, 52-59 (2007).
Tsuruoka, T. et al. *Effects of Moisture on the Switching Characteristics of Oxide-Based, Gapless-Type Atomic Switches*. Adv. Funct. Mater. 22, 70-77 (2012).
Tuma, T., et al., *Stochastic phase-change neurons*. Nat. Nanotechnol. 11, 693-699 (2016).
van de Burgt, Y. et al. *A non-volatile organic electrochemical device as a low-voltage artificial synapse for neuromorphic computing*. Nat. Mater. Advance 16:414-419, online publication, (2017).
Wang, Z. et al. *Memristors with diffusive dynamics as synaptic emulators for neuromorphic computing*. Nat. Mater. 16, 101-108 (2017).
Wong, et al. *Phase Change Memory*. Proc. IEEE 98, 2201-2227 (2010).
Yang, Y. et al. *Observation of conducting filament growth in nanoscale resistive memories*. Nat. Commun. 3, 732 (2012) (8 pages).
Yu, et al., *An Electronic Synapse Device Based on Metal Oxide Resistive Switching Memory for Neuromorphic Computation*. IEEE Trans. Electron Devices 58, 2729-2737 (2011).

* cited by examiner

… … …

ARTIFICIAL NEURONS USING DIFFUSIVE MEMRISTOR

CROSS-REFERENCE TO RELATED APPLICATIONS

This application claims the benefit under 35 U.S.C. § 119(e) of the filing date of U.S. Patent Application No. 62/628,144, for ARTIFICIAL NEURONS USING DIFFUSIVE MEMRISTOR, which was filed on Feb. 8, 2018, and which is incorporated here by reference.

GOVERNMENT FUNDING

This invention was made with government support under Grant No. FA8750-15-2-0044 awarded by the U.S. Air Force Research Laboratory (AFRL), with government support under Contract No. 2014-14080800008 awarded by the Intelligence Advance Research Projects Activity (IARPA), with government support under Grant No. FA9550-12-1-0038 by the U.S. Air Force Office for Scientific Research (AFOSR), and with government support under ECCS-1253073 awarded by the National Science Foundation (NSF). The government has certain rights in the invention.

BACKGROUND

Artificial neural networks (ANNs) have demonstrated computing ability rivaling that of the human brain. For example, AlphaGo, the first computer Go program, beat a human professional using a full size board. However, AlphaGo consumed orders of magnitude more power than a human brain requires to perform similar tasks.

SUMMARY

The present disclosure describes implementation of an artificial neuron using a diffusive memristor device based on metal nanoparticles, e.g., silver nanoparticles, in a dielectric film. The stochastic leaky integrate-and-fire dynamics and tunable integration time of the artificial neuron is determined by silver migration alone of the diffusive memristor device, or its interaction with circuit capacitance. The present disclosure also describes implementations in which such artificial neurons are integrated with non-volatile memristive synapses to build fully memristive artificial neural networks. Methods of manufacture of the artificial neurons and the non-volatile memristive synapses are also disclosed. With these integrated networks, unsupervised synaptic weight updating and pattern classification are achieved.

The details of one or more disclosed implementations are set forth in the accompanying drawings and the description below. Other features, aspects, and advantages will become apparent from the description, the drawings and the claims.

DETAILED DESCRIPTION

Figures 1A, 1B, 1C, 1D, 1E:
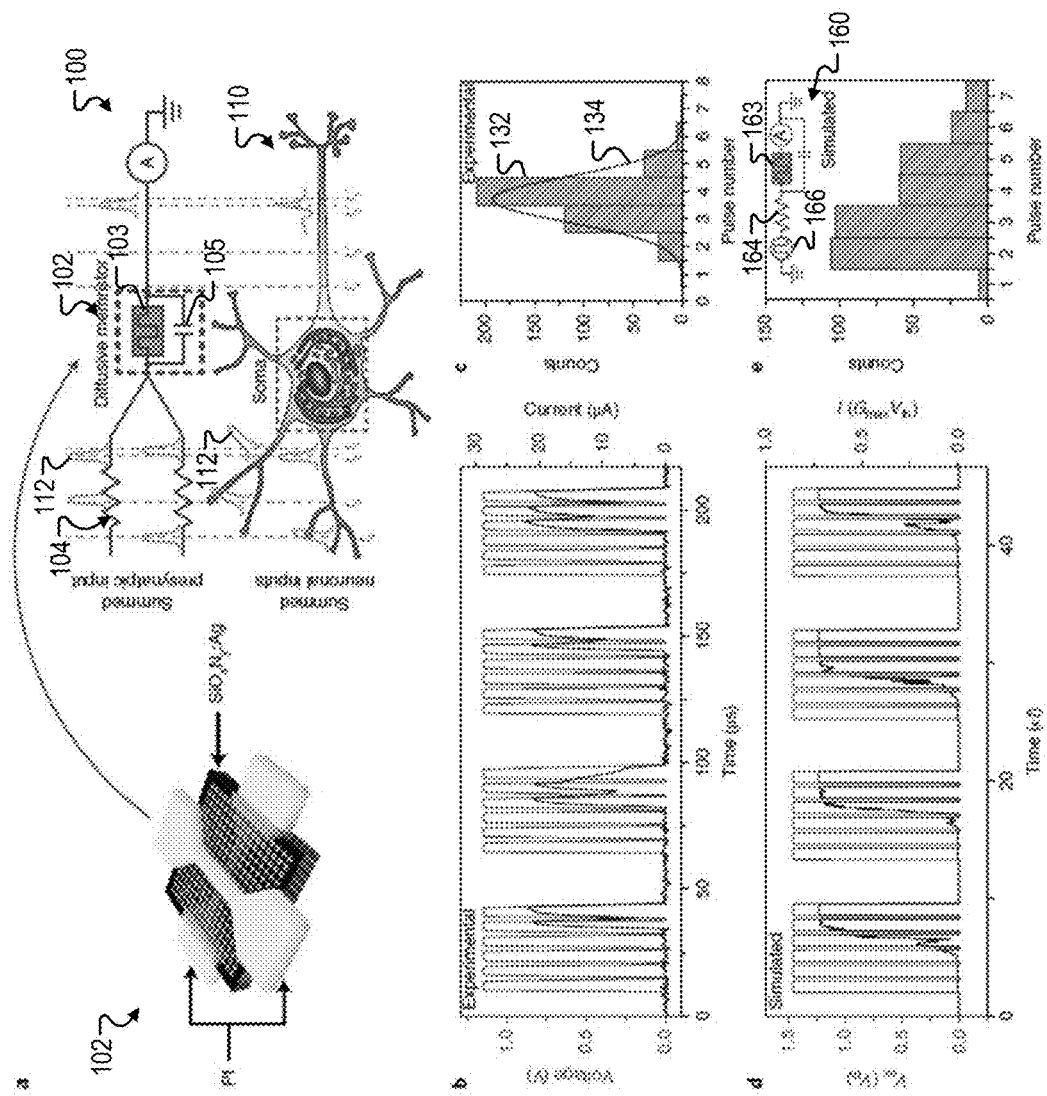
FIGS. 1a-1e illustrate an example of an electrical circuit emulating an artificial neuron, and corresponding performance characteristics.

Neuromorphic computers consisting of artificial neurons and synapses can provide a more efficient approach to implementing neural network algorithms than traditional hardware. The notable capabilities of artificial neural networks (ANNs) have been demonstrated by the performance of AlphaGo and its variants, which showed that artificial intelligence implemented on conventional computing platforms can learn on its own and exceed the skills of human beings for certain restricted classes of problems. However, ANNs like AlphaGo are realized using conventional complementary metal-oxide-semiconductor (CMOS) devices and circuits, which carry out brain-inspired computing approaches inefficiently. Consequently, AlphaGo and its variants consumed much higher power than a human brain for a much smaller neural network.

Devices that behave more like synapses and neurons can provide a more efficient implementation of a neural network. Described herein is a discrete scalable electronic device that carries out leaky integrate-and-fire signal processing and unsupervised learning, which are characteristic of ANNs, with memristive synapses, and a functioning integrated hardware at the network level. The following sections describe an artificial neuron with stochastic dynamics based on a diffusive memristor that relies on the migration of silver in a host dielectric. The temporal responses are determined by either the internal state variables of memristors alone or their interaction with the total RC time constant of the circuit elements. The disclosed artificial neuron can be used to implement convolution layers, rectified linear units (ReLUs) and fully connected layers of a functional neural network, to demonstrate pattern classification capability enabled by unsupervised synaptic weight updates in fully memristive neural networks.

In general, a neuron handles important signal-processing tasks: it integrates inputs received through synapses and generates an output signal if a threshold has been reached within a defined time interval, or allows the integrated input signal to decay (i.e. forget) if the interval is exceeded. The 'leaky integrate-and-fire model' is often used to describe this behavior in biological neurons, and this model can be emulated by volatile memristors, which transition to a high-conductance state when their stimulation threshold is exceeded. The 'leaky' membrane potential of the neuron corresponds to the volatile conductance of the memristor, which is a dynamical property for forgetting. This feature allows the neuron to automatically reinstate its resting membrane potential after it successfully fires an output pulse, and also if it fails to do so because of insufficient stimulation, thus resetting the original threshold. The decay time determines the memory span of the neuron, which enables short-term memory in ANNs. In addition to its temporal significance, the signal decay is also used in spatial integrations, as it weighs signals from different locations (including simultaneous events) in the network through their transit time along the dendrites.

FIGS. 1a-1e illustrate an example of an electrical circuit 100 emulating an artificial neuron 102, and corresponding performance characteristics. A schematic illustration of the circuit 100 is shown in FIG. 1a, which indicates that the circuit 100 includes a crosspoint diffusive memristor device 103, composed of a silicon oxynitride ($SiO_xN_y$) and silver (Ag) layer ($SiO_xN_y$:Ag layer) between two platinum (Pt) electrodes. In some implementations, gold (Au) is used in place of Pt for the top or the bottom electrode, or both. In some implementations, other materials are used for the top electrode, or the bottom electrode, or both. These materials can be any one of titanium nitride (TiN), tantalum nitride (TaN), tungsten nitride (WN), hafnium nitride (HfN), hafnium (Hf), aluminum (Al), titanium (TI), tungsten (W) or zirconium (Zr). In some implementations, other suitable oxides are used in place of $SiO_xN_y$. For example, any of the following oxides can be used in place of $SiO_xN_y$: tantalum oxide ($TaO_x$), hafnium oxide ($HfO_x$), magnesium oxide ($MgO_x$), aluminum oxide ($AlO_x$), yttrium oxide ($YO_x$), zirconium oxide ($ZrO_x$), zinc oxide ($ZnO_x$), germanium oxide ($GeO_x$), calcium oxide ($CaO_x$), gallium oxide ($GaO_x$), gadolinium oxide ($GdO_x$), erbium oxide ($ErO_x$), holmium oxide ($HoO_x$), samarium oxide ($SmO_x$), or any suitable perovskite. In some implementations, suitable alternatives to Ag are used, e.g., copper (Cu), lithium (Li), or Au.

An artificial neuron 102 is formed by the diffusive memristor 103 in parallel with a capacitor 105. In the electrical circuit 100, the diffusive memristor 103 receives software-summed presynaptic inputs via a pulsed voltage source and an equivalent synaptic resistor 104. In some implementations, the pulsed inputs are of duration 10 to 20 microseconds (μs), or some other suitable duration.

As shown by the comparative illustration in the right portion of FIG. 1a, both the electrical circuit 100 and a biological neuron 110 integrate input stimuli 112 beginning at time t1 and fire when the threshold condition is reached (e.g., at time t2'). The integrated signal decays over time such that input stimuli 112 spaced too far apart can fail to reach the threshold (e.g., the delay between times t3 and t4).

FIG. 1b illustrates an example of an experimental response of the electrical circuit 100 to multiple subthreshold voltage pulses followed by a rest period of 200 μs (only 20 μs is shown for convenience). As shown, the circuit 100 reached the threshold and 'fired' after multiple pulses. FIG. 1c shows a histogram illustrating an example of a number of sub-threshold voltage pulses that are used to successfully fire the artificial neuron (represented by the rectangles 132) compared with a Gaussian distribution (represented by the line 134).

FIG. 1d illustrates an example of a simulated response of the electrical circuit 100 to multiple sub-threshold voltage pulses as in FIG. 1b, showing behavior similar to that of the experimental response of FIG. 1b, with the resting time between pulse trains selected to allow the Ag in the device to diffuse back to the OFF state. (Only 10% of the rest period is shown for convenience.) In the illustrated example, the time is measured in temperature relaxation time, where κ is the heat transfer coefficient. FIG. 1e shows a histogram illustrating an example of simulated switching statistics with respect to pulse numbers (within each train), consistent with the experimental results shown by the example of FIG. 1c.

The inset in FIG. 1e illustrates a schematic diagram of the electrical circuit 160 for an artificial neuron used in the simulation. In some implementations, the circuit 160 is similar to the circuit 100. The circuit 160 includes a diffusive memristor device 163 to realize an artificial neuron, which is similar to the diffusive memristor 103 of the artificial neuron 102. The circuit 160 also includes a pulsed voltage source 166 and an equivalent synaptic resistor 164. The pulsed voltage source 166 and the resistor 164 are similar to the pulsed voltage source and the resistor 104, respectively, of the circuit 100. The diffusive memristor device 163 receives software-summed presynaptic inputs from the pulsed voltage source 166 through the resistor 164.

The internal Ag dynamics of a diffusive memristor device, e.g., the memristor device 103 or 163, originates from a multi-physics effect, which includes field-induced Ag mass transport from the electrodes (e.g., Ag diffusion and redox reaction), and the formation of an electrical conducting path. The synapse emulated by the circuit 100 (or circuit 160) with the artificial neuron 102 (or artificial neuron formed by diffusive memristor device 163) agrees well with the microscopic observation of Ag filament growth and rupture during threshold switching as well as the measured temporal response to voltage signals.

Considering the artificial neuron 102, when a sequence of sub-threshold pulses are applied to the artificial neuron, e.g., as shown in FIGS. 1b and 1d, the device 102 fired after a certain number of pulses and relaxed back to the resting state after the end of the pulse train. The corresponding experimentally measured histogram of FIG. 1c, and the simulated histogram of FIG. 1e, respectively, of the firing statistics show that the threshold is not sharp but has an associated probability distribution function, providing the stochastic behavior commonly observed in actual neurons. Since the internal memristor dynamics depend on the behavior of nanoparticles, the leaky integrate-and-fire mechanism observed here scales to very small device sizes.

Thus, the function of a diffusive memristor device, e.g., memristor 103, in an artificial neuron, e.g., artificial neuron 102, is distinct from that of nonvolatile drift memristors or phase-change memory devices used as long-term resistive memory elements or synapses. The diffusive memristor integrates the presynaptic signals within a time window and transitions to a low resistance state only if a threshold has been reached.

Accordingly, as discussed above with respect to FIGS. 1a and 1e, in some implementations, a leaky integrate-and-fire electrical circuit 100 (or 160) is realized using a diffusive memristor (e.g., memristor 103 or 163), which is fabricated by sandwiching a dielectric material (e.g. $SiO_xN_y$ or silicon oxide ($SiO_x$)), doped with Ag nanoclusters between two electrodes. The circuit 100 is characterized by applying voltage pulses across the artificial neuron 102 in series with resistors 112 to represent synapses, and recording the resulting output current versus time. As noted above, in some implementations, other suitable oxides are used in place of $SiO_xN_y$ or $SiO_x$, such as $TaO_x$, $HfO_x$, $MgO_x$, $AlO_x$, $YO_x$, $ZrO_x$, $ZnO_x$, $GeO_x$, $CaO_x$, $GaO_x$, $GdO_x$, $ErO_x$, $HoO_x$, $SmO_x$, or any suitable perovskite. In some implementations, suitable alternatives to Ag are used, e.g., Cu, Li, or Au.

Figures 2A, 2B, 2C:
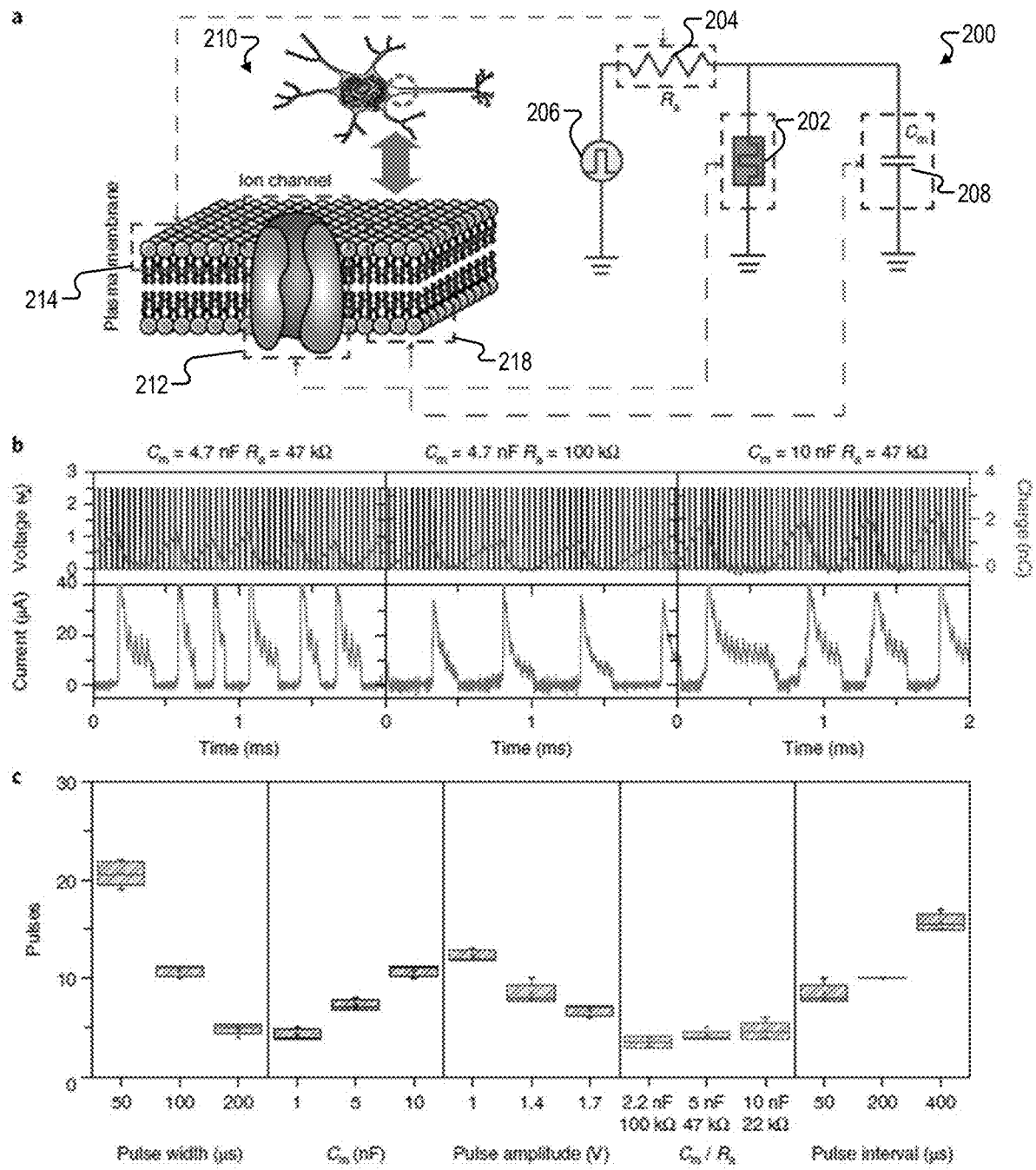
FIGS. 2a-2c illustrate an example of a second electrical circuit emulating an artificial neuron using a diffusive memristor device, and corresponding performance characteristics.

The leaky integrate-and-fire response of an artificial neuron can be tuned by adjusting the electronic circuit and the physical design around the diffusive memristor device. FIGS. 2a-2c illustrate an example of a second electrical circuit 200 emulating an artificial neuron using a diffusive memristor device 202, and corresponding performance characteristics. A schematic illustration of the circuit 200 is shown in FIG. 2a, which indicates that the circuit 200 includes a diffusive memristor device 202, which receives software-summed presynaptic inputs via a pulsed voltage source 206 and a resistor 204. In some implementations, as described in the following sections, the diffusive memristor 202 is similar to the diffusive memristor 103, being formed of the same materials and with similar structure.

The threshold behavior of the diffusive memristor 202 can be compared to that of an ion channel 212 located near the soma of a neuron 210, whereas the membrane capacitance 218 and axial resistance 214 are represented respectively by a capacitor $C_m$ 208 parallel to the memristor 202, and a resistor $R_a$ 204 in series with this combination.

In a biological neuron, e.g., neuron 210, all inputs from the surrounding neurons are fed through synapses and integrated near the soma; the membrane capacitance 218 charges up, activating the ion channels 212 if the charge reaches the threshold, and the neuron fires. When input pulses from the voltage source 206 are applied to the memristor device 202 of the circuit 200, the circuit capacitance charges with a time constant ($R_a C_m$), increasing the voltage across the diffusive memristor 202. If the threshold is reached, an Ag conduction channel is formed between the electrodes of the diffusive memristor 202, which switches the memristor and discharges (fires) the capacitor $C_m$ 208.

FIG. 2b presents data that show the capacitor charging and the subsequent firing of a current pulse by the memristor device 202. A smaller capacitance value of the capacitor $C_m$ 208 makes the integration process and spiking faster, while a larger axial input resistance $R_a$ 204 slows down the charge build-up, delaying or preventing the firing, as summarized in FIGS. 2b and 2c. The current spike across the diffusive memristor 202 coincides with the discharging of the capacitor $C_m$ 208, indicating the active release of the charge stored in the capacitor. The physical environment of a biological neuron can affect its properties; similarly, the structure of the hybrid diffusive memristor device 202 and its surrounding circuit 200 design control responses to input stimuli. The properties of the artificial neuron 200 accordingly can be tailored to achieve desirable response characteristics for specific applications.

Various factors affect the leakiness, firing threshold and firing frequency of the diffusive memristor device. For example, leakiness can be affected by a presynaptic spike interval, diffusive memristor OFF state conductance (which depends on Ag doping concentration, or device thickness, among other physical parameters), or by temperature, or any suitable combination of these factors. The firing threshold can be affected by diffusive memristor threshold voltage (which depends on Ag doping concentration, or device thickness, among other physical parameters), or signal ramping rate, or both. The firing frequency can be affected by synaptic resistance, parallel capacitance, diffusive memristor OFF state conductance, firing threshold, presynaptic spike amplitude, presynaptic spike width, presynaptic spike interval, temperature, or any suitable combination of these factors.

Interactions between artificial neurons and synapses serve as the basis for the learning of biological neural systems. FIGS. 3a-3d illustrate examples of electrical circuits 300 and 310 that are used to for artificial neurons. As shown by the electrical circuit 300 in FIGS. 3a and 3b, in some implementations, a drift memristor synapse 302 with a small weight (e.g., low conductance) is used in series with an artificial neuron 304, which includes a diffusive memristor 306 in parallel with a capacitor 308 to simulate a large circuit capacitance in this case. In some implementations, as shown by the graph of FIG. 1a, the synapse 302 has a low efficiency, e.g., the voltage drop across the synapse is large, which results in a slow build-up of charge across the circuit capacitance during the rising edge of the applied pulse. The artificial neuron integrates the input but does not fire, because it cannot reach the required threshold within the duration of this pulse. On the other hand, in some implementations, as shown by the graph of FIG. 1b, a synapse 302 with a larger weight (or a higher conductance of the drift memristor synapse) results in a faster build-up of charge across the capacitance and a successful firing event.

Figures 3A, 3B, 3C, 3D:
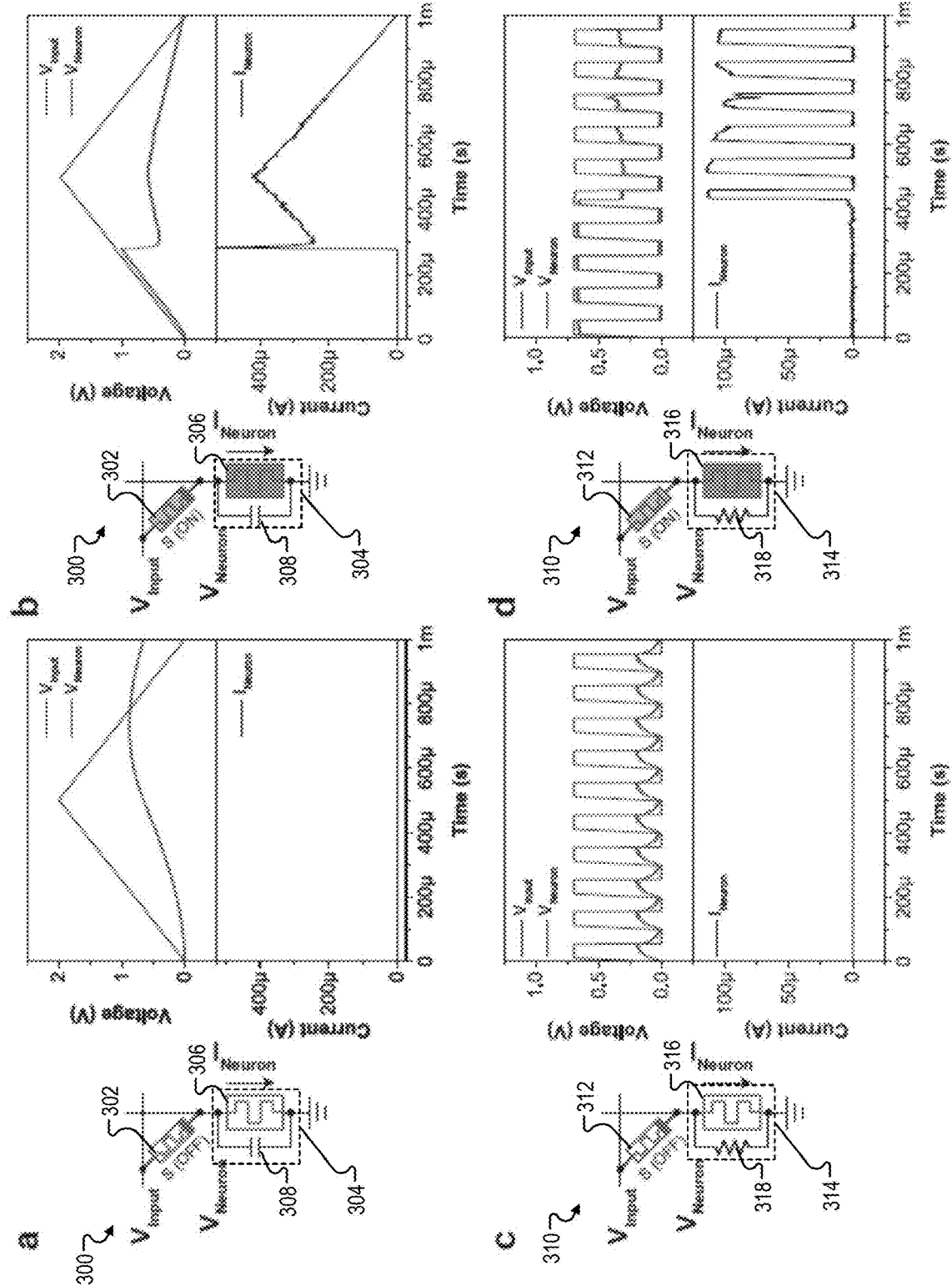
FIGS. 3a-3d illustrate examples of electrical circuits that are used to for artificial neurons.

As shown in FIGS. 3c and 3d, in some implementations, an electrical circuit 310 has a negligible circuit capacitance. The electrical circuit 310 includes a drift memristor synapse 312, which is used in series with an artificial neuron 314 that includes a diffusive memristor 316 in parallel with a resistor 318. The parallel resistor 318 may or may not be needed depending on the resistance ratio between synapses and neurons. In some implementations, the synapse 312 has a small weight, which produces a small voltage division across the artificial neuron 314, as shown by the graph of FIG. 3c. However, in some implementations, a large weight of the synapse 312 leads to the observed firing of the artificial neuron as the voltage drop across the diffusive memristor (parallel resistor) becomes larger and exceeds the threshold, as shown by the graph of FIG. 3d.

Figures 4A, 4B:
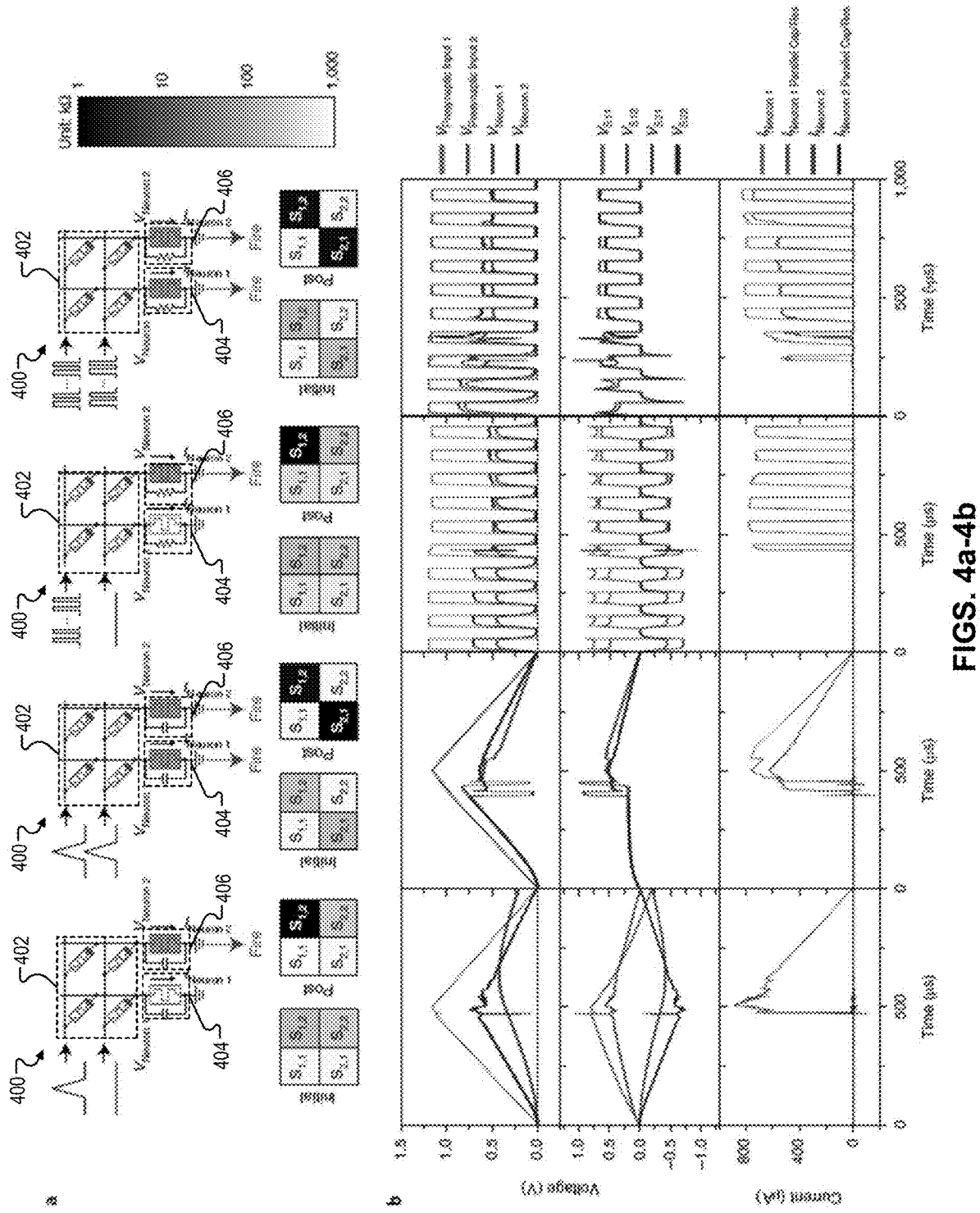
FIGS. 4a and 4b illustrate an example of an electrical circuit that includes a 2×2 drift memristor synapse array connected to diffusive memristor artificial neurons at each output.

FIGS. 4a and 4b illustrate an example of an electrical circuit 400 that includes a 2×2 drift memristor synapse 402 array connected to diffusive memristor artificial neurons 404 and 406 at each output. In some implementations, the electrical circuit 400 is used for unsupervised synaptic weight update caused by neuron firing.

FIG. 4a shows four iterations of the electrical circuit 400, each with a different combination of states for the synapse array 402. All the synapses in the array 402 are initialized to small weights, with some variation due to the stochastic nature of their switching. A triangular voltage pulse (first column of FIG. 4a) or a train of rectangular spikes (third column of FIG. 4a) are applied to the first row of synapses in the synapse array 402, to emulate low and high circuit capacitance, respectively. The second row of synapses in the synapse array 402 is kept at nearly zero bias. The '10' digital input vector pattern is used in this description, but analogue inputs can also be used. As shown in the first and third columns of FIGS. 4a and 4b, the neuron 406 connected to the right-hand column of the synapse array 402 fires because the synapse S12 had a slightly larger initial weight. The firing of the neuron 406 pulls down the voltage of the bottom electrodes of S12 and S22, resulting in a large voltage spike (red lines in the middle panels of FIG. 4b) across S12, further enhancing its weight.

The '11' digital input vector pattern is applied to the electrical circuit 400 in the second and fourth columns of FIG. 4a. In such cases, when either triangular voltage pulses (second column of FIG. 4a) or trains of rectangular spikes (fourth column of FIG. 4a), corresponding to high and low circuit capacitance, respectively, are applied to both rows of the 2×2 synapse array 402, both neurons 404 and 406 fire, enhancing the weights of synapses S12 and S21, as shown by the second and fourth columns of FIG. 4b.

Figures 5A, 5B, 5C, 5D, 5E, 5F, 5G, 5H, 5I:
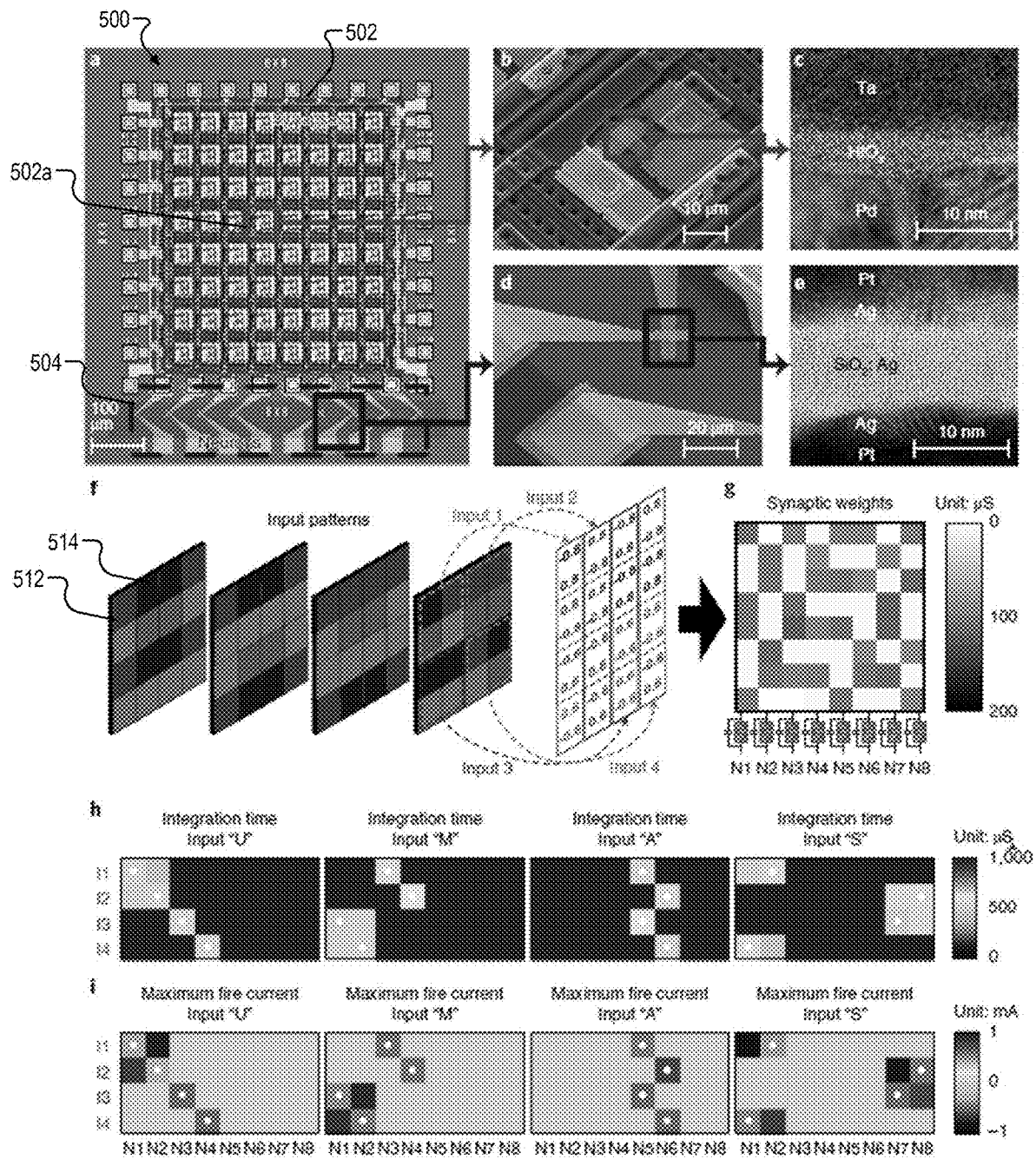
FIGS. 5a-5i illustrate an example of a fully integrated memristive neural network chip and its characteristics.

FIGS. 5a-5i illustrate an example of a fully integrated memristive neural network chip 500 and its characteristics. FIG. 5a shows an overview of the integrated chip 500, which includes a one-transistor-one-memristor (1T1R) synaptic array 502 and diffusive memristor neurons 504.

The synapses in the synaptic array, e.g., synapse 502a, are built by integrating drift memristors with foundry-made transistor arrays using back-end-of-the-line processes. In some implementations, memristors made of palladium (Pd), hafnium oxide ($HfO_2$) and tantalum (Ta) are used. In such implementations, each $Pd/HfO_2/Ta$ memristor is connected to a series transistor. In other implementations, the drift memristor is realized by another suitable nonvolatile memristor. In such implementations, Pd can be replaced by any one of platinum (Pt), titanium nitride (TiN), tantalum nitride (TaN), tungsten nitride (WN), hafnium nitride (HfN), or gold (Au); $HfO_2$ can be replaced by any one of tantalum oxide ($TaO_x$), aluminum oxide ($AlO_x$), titanium oxide ($TiO_x$), tungsten oxide ($WO_x$), or any suitable polymeric material; Ta can be replaced by any one of hafnium (Hf), aluminum (Al), titanium (TI), tungsten (W) or zirconium (Zr). The transistor is one of an n-type enhancement-mode transistor, a p-type enhancement-mode transistor, an n-type depletion-mode transistor, or a p-type depletion-mode transistor.

FIG. 5b shows the detailed structure of a single 1T1R cell, e.g., the synapse 502a, and associated connections. When all the transistors are turned on, the 1T1R array works as a fully connected memristor crossbar. In such cases, the synapse includes an amorphous HfO2 layer sandwiched between Pd and Ta electrodes, as shown in FIG. 5c.

In some implementations, the diffusive memristor neurons 504 have a $SiO_x$:Ag layer sandwiched between Pt electrodes. FIG. 5d illustrates the junction of such a single diffusive memristor used as an artificial neuron. A transmission electron micrograph of its cross-section, illustrated by FIG. 5e, shows the amorphous nature of the background $SiO_x$ dielectric lattices and the nanocrystalline Ag layer.

In some implementations, a fully memristive neural network realized using the integrated chip 500 is used to classify pre-synaptic signals. In some of these implementations, the synapses are pre-programmed to have different weights, which could be the result of, for example, a learning process. Four letter patterns, e.g., 'U', 'M', 'A' and '5', with artificially added noise are used as example inputs. FIG. 5f shows two types of squares, 512 and 514, which represent input differential voltages fed to the rows of the synaptic array 502. For example, a square 512 can indicate a +0.8 V/−0.8 V input pair, while a square 514 can indicate a −0.6 V/+0.6 V input pair. The input pattern is divided into four sub-images of size 2×2 with a stride of two, e.g., Input 1, Input 2, Input 3 and Input 4. Each sub-image is unrolled into a single column input vector (eight voltages) and fed into the network (eight rows) at each time. For each sub-image, there is a corresponding convolutional filter implemented by eight memristor synapses in a column, with a total of eight filters (eight columns) in the 8×8 array. The measured weights are depicted in FIG. 4g after programming. The negative values of the convolution matrices are mapped to the conductance of memristor cells by grouping memristors from adjacent rows to form a differential pair. The results of the convolution of the eight filters to each sub-image are concurrently revealed by the firing of their corresponding diffusive memristor artificial neurons, which serve the role of ReLUs. This network produces a unique response for each input pattern, as illustrated in FIGS. 5h and 5i, in the form of integration time and the maximum fire current. Such a fully integrated memristive neural network using the integrated circuit chip 500, comprising memristor-based artificial synapses and artificial neurons, can be expanded to implement learning systems of higher complexity, such as multilayer neuron networks, in an energy-efficient manner.

Figures 6A, 6B, 6C, 6D:
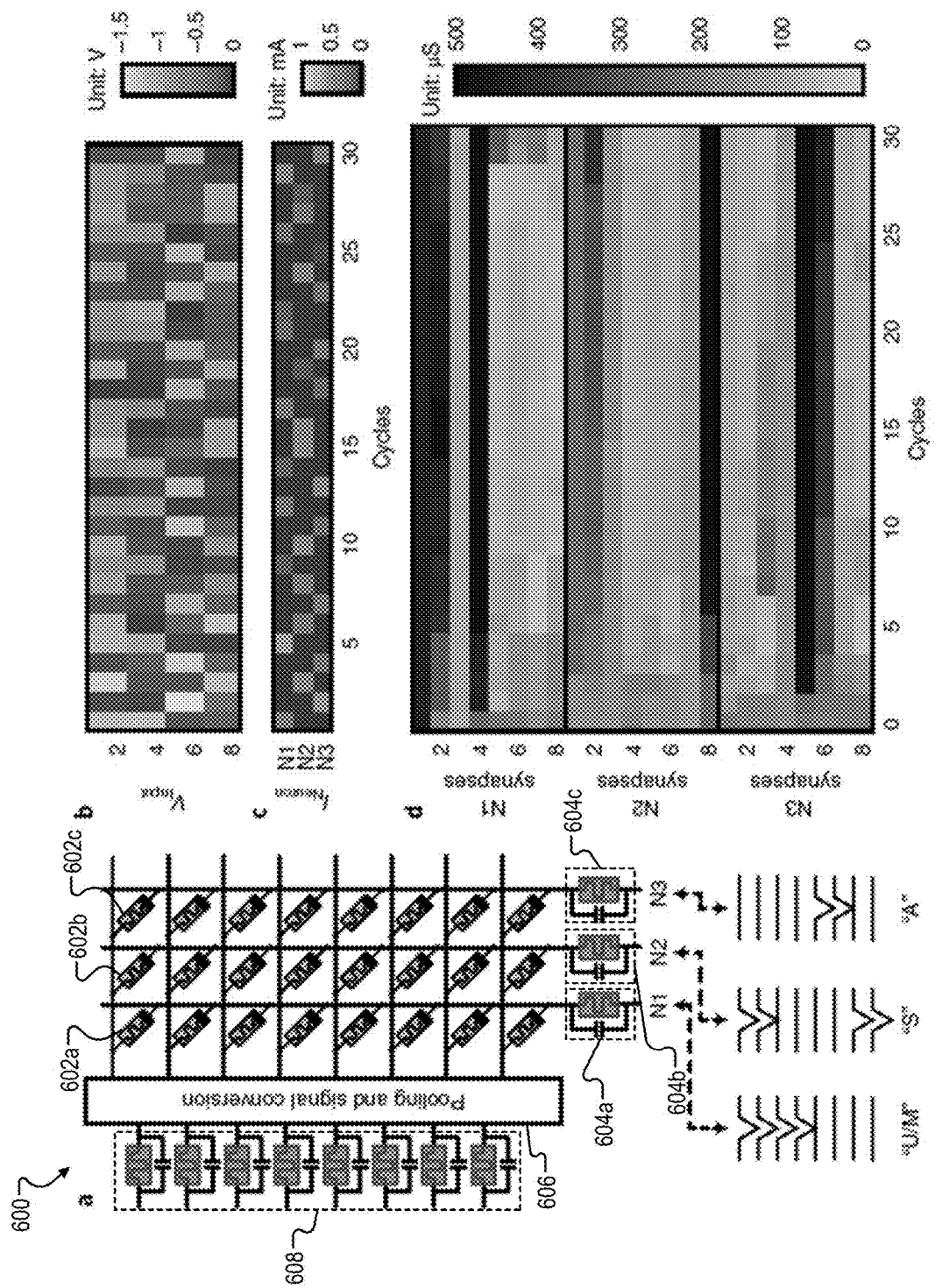
FIGS. 6a-6d illustrate an example of an electrical circuit that uses an array of drift memristor synapses and diffusive memristor artificial neurons for clustering of the inputs.

Spike-timing-dependent plasticity is a prevalent protocol for synaptic weight update in spiking neural networks. The artificial neurons described herein can be used to derive a simple spike-timing-dependent plasticity scheme, e.g., using the circuit 400 of FIG. 4a, to train a fully connected layer in an unsupervised approach, which complements the convolution and ReLU layers in FIGS. 5a-5i and enables a functional convolutional network. Since the drift memristor synapses encode the conditional probability, the neurons tend to respond to the means of inputs associated with fire events, carrying out clustering of the inputs. FIGS. 6a-6d illustrate an example of an electrical circuit 600 that uses an array of drift memristor synapses, e.g., synapses 602a, 602b and 602c, and diffusive memristor artificial neurons, e.g., artificial neurons 604a, 604b and 604c, for clustering of inputs. FIG. 6a shows that, in the circuit 600, software pooling and signal conversion 606 is used to convert the outputs of the ReLU layer 608 to the inputs of the fully connected layer. Lateral inhibition is deployed to enhance the discrimination of the inputs and make the self-adapting network energy efficient. After a few cycles of uncertainty demonstrated by FIGS. 6b and 6c, where the conductance of synapses concentrates around the initial values (e.g., approximately 100 µs), the synapses are programmed by simple spike-timing dependent plasticity rules. As shown in FIG. 6d, undergoing either potentiation or depression, patterns of synapses associated with the artificial neurons 604a (N1), 604b (N2) and 604c (N3) quickly gain similarities by self-organizing processes to one of the prototypical patterns in FIG. 6a (e.g., '11110000', '11000011' and '00001100', respectively).

The synapses can show different responses to the learning rules. For instance, the third synapse of the column coupled to neuron 604a and the seventh synapse of the column coupled to neuron 604b are much less potentiated compared to other synapses in the circuit 600, which can be due to the device-to-device variation of threshold conditions of drift memristors. The quick divergence of conductance of drift memristors indicates a fast learning rate, which is dependent on the firing time or pulse width of diffusive memristor neurons. Such convergence is also reflected by the magnitude (or threshold) of input patterns in FIG. 6b. The magnitude of a specific pattern decreases in the first few cycles and then becomes stable. This is because diverged conductances of drift memristors tend to saturate so that further increment (or decrement) in conductance will become less effective when they are close to the upper (or lower, respectively) bound of the conductance range.

Accordingly, the preceding sections describe a stochastic leaky integrate-and-fire artificial neuron based on a discrete scalable diffusive memristor, featuring silver dynamics similar to that of actual neuron ion channels. This faithfully realizes electronic neural functionality using a simple circuit that is in contrast to traditional approaches that require tens to hundreds of CMOS devices. The preceding sections also demonstrate that these artificial neurons can utilize the integrate-and-fire function to enable unsupervised synaptic weight updating and pattern classification on integrated memristive convolution neural networks.

In some implementations, the diffusive memristor devices described above, e.g., diffusive memristor 102, are fabricated on p-type Si wafers with 100 nanometer (nm) thermal oxide. The bottom Pt electrodes are patterned by photolithography, followed by evaporation and lift-off of ~20/2 nm Pt/Ti (titanium). A doped dielectric layer of a certain thickness is deposited at room temperature by reactively co-sputtering Si and Ag in argon (Ar), nitrogen ($N_2$) and oxygen ($O_2$). In some implementations, the thickness is in the range of 10 nm to 100 nm. For example, the thickness is approximately 16 nm in one implementation. The Pt top electrodes are subsequently patterned by photolithography followed by evaporation and lift-off processes. In some implementations, the Pt top electrodes have thickness in the tens of nanometers, e.g., approximately 30 nm in one implementation. Electrical contact pads of the bottom Pt electrodes are first patterned by photolithography and then subjected to reactive ion etching with mixed CHF3 and O$_2$ gases.

The drift memristors share same substrate and bottom electrodes with the diffusive memristors. The HfO$_2$ switching layer is deposited by atomic layer deposition at 250° C., which is subsequently patterned for reactive ion etching. Finally, top electrodes of 50/10 nm Ta/Pd are sputtered and lifted off.

As mentioned previously, the synapses used in the integrated circuit chip 500 used for the fully integrated memristive neural network are a 1T1R array with Pd/HfO$_2$/Ta memristors. In some implementations, the front-end and part of the back-end process for the transistor array is done in a commercial fabrication facility ("fab"). To make a good connection between the fab metal layers and the memristors, argon plasma treatment is done to remove the native metal oxide layers followed by the deposition of Ag in the range of 5 nm thickness, and Pd in the range of 200 nm thickness, by sputtering and lift-off process, and annealing at 300° C. for half hour. A Ta adhesive layer with thickness in the range of 5 nm and Pd bottom electrodes with thickness in the range of 60 nm are then deposited by sputtering and patterned by lift-off. The HfO$_2$ switching layer is deposited by atomic layer deposition at 250° C. The patterning of the switching layer is done by photolithography and reactive ion etching. Top electrodes of Ta with thickness in the range of 50 nm are sputtered and lifted off. The bottom electrodes of diffusive memristors are patterned by photolithography followed by evaporation and lift-off of about 2/20/2 nm Ti/Pt/Ag. To enhance the contact between the diffusive memristor electrodes and the column wires of the drift memristors, 100 nm Pd patches are patterned, sputtered and lifted off. The doped dielectric layer with thickness of approximately 10 nm is patterned and deposited at room temperature by co-sputtering SiO$_2$ and Ag in Ar, followed by lift-off. The approximately 2/30 nm Ag/Pt top electrodes are subsequently patterned by photolithography followed by evaporation and lift-off processes.

To model the dynamics of a diffusive memristor, e.g., the integrate-and-fire behavior of the diffusive memristor/capacitor, an interplay of electric, heat and Ag-nanoparticle degrees of freedom are considered. Ag-nanoparticle diffusion is described by the Langevin equation:

$$\eta \frac{d^2 x_i}{dt^2} = -\frac{\partial U(x_i)}{\partial x_i} + \alpha \frac{V(t)}{L} + \sqrt{2\eta k_B T}\, \zeta. \quad (1)$$

$x_i$ is the location of ith Ag-nanoparticle, which drifts with time t in the potential landscape $U(x_i)$ under the action of the friction force $$\eta \frac{dx_i}{dt}$$

with particle viscosity $\eta$, the electric force $$\alpha \frac{V(t)}{L}$$

with induced charge $\alpha$ and distance L between electrodes, and the random force described by the unbiased $\delta$-correlated white noise $\zeta$, $\langle \zeta(t) \rangle = 0$, $\langle \zeta(0)\zeta(t) \rangle = \delta(t)$. The particular shape of the potential does not qualitatively change the result and should take into account the interfacial interaction attracting Ag-nanoparticles to the large clusters as well as pinning of Ag-nanoparticles to the inhomogeneities of the insulating matrix resulting in a large number of smaller potential wells. The relative strength of the potential with respect to the thermal fluctuation energy $k_B$ T (with the Boltzmann constant $k_B$ and the local Ag-nanoparticle temperature T, which can significantly differ from the device ambient temperature) determines the diffusion kinetics. Due to Joule dissipation, the temperature T changes in time according to the Newton cooling law of equation (2):

$$\frac{dT}{dt} = \frac{V^2}{\mathbb{C}_T R} - \kappa(T - T_0) \quad (2)$$

In equation (2), $\kappa$ is the heat transfer coefficient describing heat flux from the device and $\mathbb{C}_T$ is the system heat capacitance. The input power is determined by the memristor resistance $R(x_1, x_2, \ldots, x_N)$ and voltage V(t) across the device. The resistance is controlled by the sequential tunneling processes of electrons from one Ag-nanoparticle to another and can be written as $= R_t \sum_0^N e^{(x_{i+1} - x_i)/\lambda}$, where $x^0 = -L$ and $x_{N+1} = L$ are the positions of the device terminals, $R_t$ is the resistance amplitude and $\lambda$ is the tunneling length. A minimum value $R_{min} = (N+1)R_t e^{2L/((N+1)\lambda)}$ (occurring when all Ag-nanoparticles are equally separated) is used as a unit of resistance, while the voltage is normalized to the switching threshold value determined self-consistently as the value when the probability of switching is maximal. As for any distributed system with a high resistance, the diffusive memristor has an intrinsic capacitance $C_M$. Considering the circuit shown in the inset of FIG. 1e, the equation for the voltage across the memristor driven by the applied voltage $V_{ex}(t)$ can be derived as shown in equation (3):

$$\tau_0 \frac{dV}{dt} = V_{ex}(t) - \left(1 + \frac{R_{ex}}{R(x)}\right)V \quad (3)$$

In equation (3), the "RC" time is defined as $\tau_0 = C_M R_{ex}$ with the resistance $R_{ex}$ of the external or signal input wires connected in series with the memristor (for simulations we used $$\kappa \tau_0 = 16 \text{ and } \frac{R_{ex}}{R_{min}} = 1).$$

While this document may describe many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination in some cases can be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is:

1. An artificial neuron device, comprising:
   a diffusive memristor device comprising:
      a bottom electrode;
      a top electrode formed opposite the bottom electrode; and
      a dielectric layer disposed between the top electrode and the bottom electrode, the dielectric layer comprising one of an oxide, a perovskite, or a polymer, wherein the dielectric layer is doped with a metal;
   a resistor coupled in parallel to the diffusive memristor device;
   a voltage source that is configured to generate voltage pulses; and
   a drift memristor coupled in series with the diffusive memristor device and the resistor, the drift memristor configured to forward the voltage pulses from the voltage source to the diffusive memristor device.

2. The artificial neuron device of claim 1, wherein the bottom electrode comprises one of platinum (Pt), gold (Au), titanium nitride (TiN), tantalum nitride (TaN), tungsten nitride (WN), hafnium nitride (HfN), hafnium (Hf), aluminum (Al), titanium (TI), tungsten (W) or zirconium (Zr), and
   wherein the top electrode comprises one of platinum (Pt), gold (Au), titanium nitride (TiN), tantalum nitride (TaN), tungsten nitride (WN), hafnium nitride (HfN), hafnium (Hf), aluminum (Al), titanium (TI), tungsten (W) or zirconium (Zr).

3. The artificial neuron device of claim 1, wherein the oxide included in the dielectric layer comprises one of silicon oxynitride ($SiO_xN_y$:Ag), silicon oxide ($SiO_x$), tantalum oxide ($TaO_x$), hafnium oxide ($HfO_x$), magnesium oxide ($MgO_x$), aluminum oxide ($AlO_x$), yttrium oxide ($YO_x$), zirconium oxide ($ZrO_x$), zinc oxide ($ZnO_x$), germanium oxide ($GeO_x$), calcium oxide ($CaO_x$), gallium oxide ($GaO_x$), gadolinium oxide ($GdO_x$), erbium oxide ($ErO_x$), holmium oxide ($HoO_x$), or samarium oxide ($SmO_x$).

4. The artificial neuron device of claim 1, wherein the metal included in the dielectric layer comprises one of silver (Ag), copper (Cu), lithium (Li), or gold (Au).

5. The artificial neuron device of claim 1, further comprising a capacitor coupled in parallel to the diffusive memristor device.

6. The artificial neuron device of claim 5, further comprising:
   a voltage source that is configured to generate voltage pulses; and
   a resistor coupled in series with the diffusive memristor device, the resistor configured to forward the voltage pulses from the voltage source to the diffusive memristor device.

7. The artificial neuron device of claim 6, wherein at least one of a capacitance value of the capacitor or a resistance value of the resistor is selected to enable the diffusive memristor device to reach a threshold voltage for conductance upon integrating one or more voltage pulses within a known time window.

8. The artificial neuron device of claim 7, wherein a silver conductance channel is formed within the dielectric layer between the top electrode and the bottom electrode of the diffusive memristor device upon reaching the threshold voltage for conductance.

9. The artificial neuron device of claim 6, wherein the resistor comprises a drift memristor.

10. An electrical circuit, comprising:
   a first diffusive memristor device, comprising:
      a first bottom electrode,
      a first top electrode formed opposite the bottom electrode, and
      a first dielectric layer disposed between the first top electrode and the first bottom electrode, the first dielectric layer comprising one of an oxide, a perovskite, or a polymer, wherein the first dielectric layer is doped with a metal;
   an array of resistors, the array including a first resistor in a first column of the array, the first resistor coupled in series with the first diffusive memristor device and configured to forward voltage pulses from a voltage source to the first diffusive memristor device; and
   one or more additional diffusive memristor devices, each of the one or more additional diffusive memristor devices comprising:
      a second bottom electrode,
      a second top electrode formed opposite the bottom electrode, and
      a second dielectric layer disposed between the second top electrode and the second bottom electrode, the second dielectric layer comprising one of an oxide, a perovskite, or a polymer, wherein the second dielectric layer is doped with a metal,
   wherein the first column of the array is coupled in series to the first diffusive memristor device, and
   wherein each remaining column of the array is coupled in series to a distinct one of the one or more additional diffusive memristor devices.

11. The electrical circuit of claim 10, wherein the oxide included in at least one of the first dielectric layer or the second dielectric layer comprises one of silicon oxynitride ($SiO_xN_y$:Ag), silicon oxide ($SiO_x$), tantalum oxide ($TaO_x$), hafnium oxide ($HfO_x$), magnesium oxide ($MgO_x$), aluminum oxide ($AlO_x$), yttrium oxide ($YO_x$), zirconium oxide ($ZrO_x$), zinc oxide ($ZnO_x$), germanium oxide ($GeO_x$), calcium oxide ($CaO_x$), gallium oxide ($GaO_x$), gadolinium oxide ($GdO_x$), erbium oxide ($ErO_x$), holmium oxide ($HoO_x$), or samarium oxide ($SmO_x$).

12. The electrical circuit of claim 10, wherein the metal included in at least one of the first dielectric layer or the second dielectric layer comprises one of silver (Ag), copper (Cu), lithium (Li), or gold (Au).

13. The electrical circuit of claim 10, wherein at least one of the first bottom electrode or the second bottom electrode comprises one of platinum (Pt), gold (Au), titanium nitride (TiN), tantalum nitride (TaN), tungsten nitride (WN), hafnium nitride (HfN), hafnium (Hf), aluminum (Al), titanium (TI), tungsten (W) or zirconium (Zr), and
   wherein at least one of the first top electrode or the second top electrode comprises one of platinum (Pt), gold (Au), titanium nitride (TiN), tantalum nitride (TaN), tungsten nitride (WN), hafnium nitride (HfN), hafnium (Hf), aluminum (Al), titanium (TI), tungsten (W) or zirconium (Zr).

14. The electrical circuit of claim 10, further comprising a capacitor coupled in parallel to the first diffusive memristor device,
- wherein at least one of a capacitance value of the capacitor or a resistance value of the first resistor is selected to enable the first diffusive memristor device to reach a threshold voltage for conductance upon integrating one or more voltage pulses within a known time window, and
- wherein a metal conductance channel is formed within the first dielectric layer between the first top electrode and the first bottom electrode of the first diffusive memristor device upon reaching the threshold voltage for conductance.

15. An integrated circuit chip, comprising:
- an array of synaptic devices, each synaptic device comprising a transistor and a drift memristor; and
- a plurality of artificial neuron devices, each artificial neuron device including a diffusive memristor device comprising:
  - a bottom electrode,
  - a top electrode formed opposite the bottom electrode, and
  - a dielectric layer disposed between the top electrode and the bottom electrode, the dielectric layer comprising one of an oxide, a perovskite, or a polymer, wherein the dielectric layer is doped with a metal.

16. The integrated circuit chip of claim 15, wherein the oxide included in the dielectric layer comprises one of silicon oxynitride ($SiO_xN_y$:Ag), silicon oxide ($SiO_x$), tantalum oxide ($TaO_x$), hafnium oxide ($HfO_x$), magnesium oxide ($MgO_x$), aluminum oxide ($AlO_x$), yttrium oxide ($YO_x$), zirconium oxide ($ZrO_x$), zinc oxide ($ZnO_x$), germanium oxide ($GeO_x$), calcium oxide ($CaO_x$), gallium oxide ($GaO_x$), gadolinium oxide ($GdO_x$), erbium oxide ($ErO_x$), holmium oxide ($HoO_x$), or samarium oxide ($SmO_x$),
- wherein the metal included in the dielectric layer comprises one of silver (Ag), copper (Cu), lithium (Li), or gold (Au),
- wherein the bottom electrode comprises one of a platinum layer or a gold layer, and
- wherein the top electrode comprises one of a platinum layer or a gold layer.

17. The integrated circuit chip of claim 15, wherein, for each synaptic device, the drift memristor includes palladium (Pd), hafnium oxide (HfO2) and tantalum (Ta).

18. The integrated circuit chip of claim 15, wherein, for each synaptic device, the drift memristor includes a combination of a first material, a second material and a third material,
- wherein the first material is one of platinum (Pt), titanium nitride (TiN), tantalum nitride (TaN), tungsten nitride (WN), hafnium nitride (HfN), gold (Au),
- wherein the second material is one of tantalum oxide ($TaO_x$), aluminum oxide ($AlO_x$), titanium oxide ($TiO_x$), tungsten oxide ($WO_x$, a perovskite or a polymeric material, and
- wherein the third material is one of hafnium (Hf), aluminum (Al), titanium (TI), tungsten (W) or zirconium (Zr).

* * * * *

UNITED STATES PATENT AND TRADEMARK OFFICE
CERTIFICATE OF CORRECTION

PATENT NO. : 11,586,884 B2
APPLICATION NO. : 16/270848
DATED : February 21, 2023
INVENTOR(S) : Jianhua Yang et al.

Page 1 of 1

It is certified that error appears in the above-identified patent and that said Letters Patent is hereby corrected as shown below:

On the Title Page

Column 1, (72) Inventors:
After Qing Wu, delete "Manilus" and insert -- Manlius --.

In the Claims

Column 14, Line 25:
In Claim 18, delete "($WO_x$," and insert -- ($WO_x$), --.

Signed and Sealed this
Ninth Day of April, 2024

Katherine Kelly Vidal
*Director of the United States Patent and Trademark Office*